US006678138B2

(12) United States Patent
Glaser et al.

(10) Patent No.: US 6,678,138 B2
(45) Date of Patent: Jan. 13, 2004

(54) ENVIRONMENTALLY INSENSITIVE SURGE SUPPRESSOR APPARATUS AND METHOD

(75) Inventors: Ronald William Glaser, Ector, TX (US); James Albert Glaser, Ector, TX (US); Benny John Whitehead, Ector, TX (US)

(73) Assignee: GE-ACT Communications, Inc., Bonham, TX (US)

( * ) Notice: Subject to any disclaimer, the term of this patent is extended or adjusted under 35 U.S.C. 154(b) by 0 days.

(21) Appl. No.: 09/848,756

(22) Filed: May 3, 2001

(65) Prior Publication Data

US 2001/0022716 A1 Sep. 20, 2001

Related U.S. Application Data

(63) Continuation of application No. 09/219,213, filed on Dec. 22, 1998.

(51) Int. Cl.[7] .............................. H02H 5/04; H02H 1/00
(52) U.S. Cl. ..................... 361/103; 361/124; 361/104; 361/126

(58) Field of Search .......................... 361/58, 103, 104, 361/111, 124, 126, 127, 748, 760, 761, 91.3, 93.8; 337/97, 158, 159

(56) References Cited

U.S. PATENT DOCUMENTS

| 3,562,586 | A | * | 2/1971 | Carter |
| 3,828,289 | A | * | 8/1974 | Hickling ..................... 337/5 |
| 5,010,438 | A | * | 4/1991 | Brady ......................... 361/56 |
| 5,303,116 | A | * | 4/1994 | Grotz ........................ 361/111 |
| 5,353,189 | A | * | 10/1994 | Tomlinson ................. 361/118 |
| 5,671,284 | A | * | 9/1997 | Buer ........................... 380/29 |
| 6,282,073 | B1 | * | 8/2001 | Glaser et al. ............... 361/104 |

* cited by examiner

Primary Examiner—Kim Huynh
(74) Attorney, Agent, or Firm—Carr LLP

(57) ABSTRACT

A surge suppressor conducts heat from a surge protection component (SSC) through a heat conductive element, such as a copper pad, on a printed circuit board, to at least one thermal fuse to cause the thermal fuse to open when the resistance of the SSC begins to decrease, resulting in an increase of heat generated by the SSC.

76 Claims, 2 Drawing Sheets

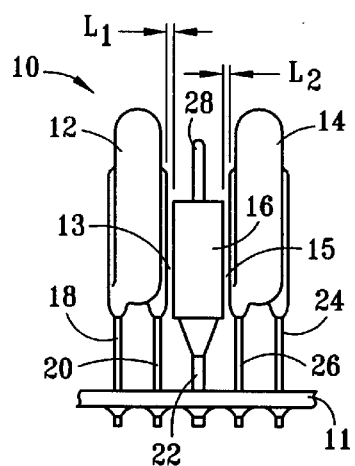
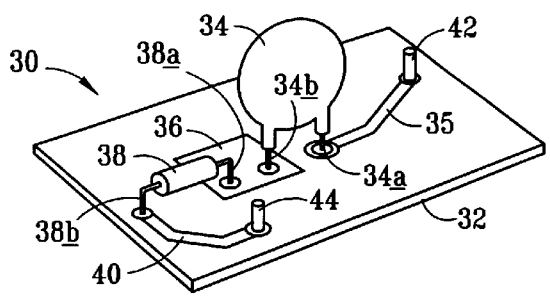
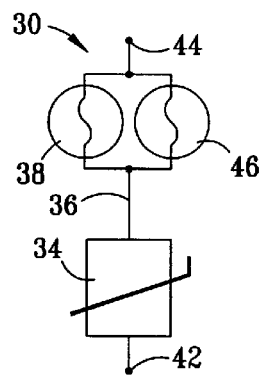
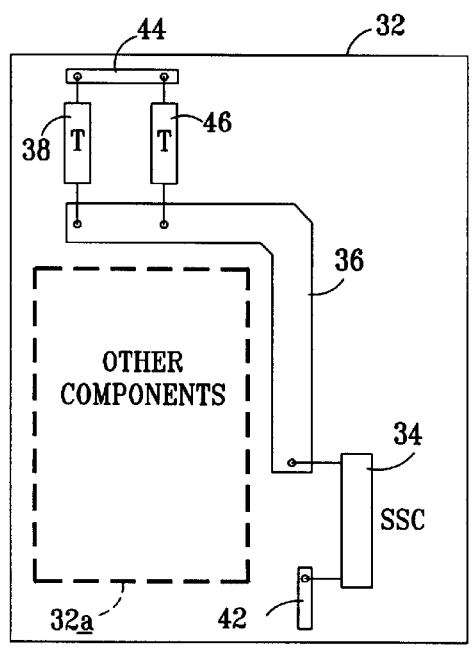
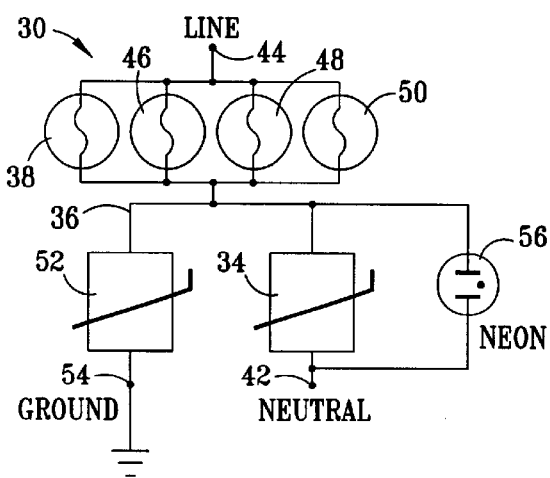

ENVIRONMENTALLY INSENSITIVE SURGE SUPPRESSOR APPARATUS AND METHOD

CROSS-REFERENCE TO RELATED APPLICATION

This application is a Continuation of U.S. patent application Ser. No. 09/219,213, to Glaser, et al. entitled "ENVIRONMENTALLY INSENSITIVE SURGE SUPPRESSOR APPARATUS AND METHOD" filed Dec. 22, 1998.

TECHNICAL FIELD

This invention is related to surge suppressors and, more particularly, to surge suppressors which provide protection against transient voltage and current surges as well as against the failure of elements of the suppressor itself.

BACKGROUND

Transient voltages or spikes can be very detrimental to electronic equipment commonly found in households, businesses, and communications networks. Even though each of such spikes may be of a very short duration, a cumulative effect of many such spikes may harm components of the electronic equipment resulting in premature failure of the equipment.

One method of suppressing voltage surges is to use a surge arrestor, or suppression, circuit incorporating solid state surge suppression elements such as metal oxide varistors, commonly referred to by the acronym MOV. The energy of the surge is then dissipated by the MOV instead of the attached appliances or other circuitry. Such an arrangement works well until the MOV reaches the end of its life. The MOV averts failure primarily by entering into a low resistance mode. However, in such a mode, the MOV generates a large quantity of heat, and may ignite a fire or, alternatively, may short line voltage to ground. Such a shorting may cause line protection elements, such as a fuse or a circuit breaker, to blow or trip, respectively, thereby disabling any downstream circuits or appliances powered by the line voltage. Any disabling of downstream equipment, especially in commercial applications, can be disastrous for the user. For example, the disabling of telephone circuitry from operation can result in the loss of millions of dollars of revenue, and the disabling of life support equipment in a hospital may result in a loss of life. It can be appreciated, therefore, that if an MOV enters into a low resistance mode, it may result in catastrophic consequences. Furthermore, every time that an MOV enters into a low resistance mode, the probability of catastrophic consequences occurring increases. Therefore, it is generally desirable to replace an MOV after it has once entered into a low resistance mode, to thereby avert a possible catastrophic failure. Unfortunately, it is difficult to always know when an MOV enters into a low resistance mode so that it may be replaced. While it is difficult to know when an MOV enters into a low resistance mode, it would be desirable to know when an MOV does fail, and for the effect of such failure on a previously protected circuit to be minimized.

Surges in a commercial environment are typically suppressed on the AC voltage lines of primary and secondary AC distribution panels to protect sensitive equipment which receive power from the such distribution power panels. Such surge suppression is essentially mounted in parallel to electronic equipment and provides an easy or quick path for lightning and transient surges to divert to ground instead of damaging sensitive electronic equipment that often comprise electrically sensitive semiconductor chips. Surge suppression circuitry mounted in such a manner generally comprises four basic states of operation:

1. Normal State—There is a high impedance path between ground and AC power. Current leakage is in the range of microamps. Heat is not an issue. The voltage level applied to the suppression circuitry is below a turn-on voltage of the surge suppressor.

2. High Voltage Transient Turn On State—A very low impedance path between a voltage source and ground occurs for micro-seconds, providing a low impedance path for transient energy. Transient surge voltage must exceed the turn on level of the suppression circuitry for this state to occur. Heat is a byproduct of diverting a large amount of transient energy to ground even though the impedance level is low. When the surge is of a short duration, the heat is not normally destructive in nature. The total power consumed in generating heat is less than the amount required to trip or blow breaker/fuse protective circuits.

3. Permanent Failure—A very low impedance path between a voltage source and ground. The low impedance path of the surge suppressor allows a sufficiently high level of energy to blow or trip a fuse/breaker protective circuit. If protection against excessive current is not a part of the surge suppressor design, then fuses or circuit breakers found in the AC distribution panel will be blown off-line, hopefully preventing hazardous conditions such as an electrical fire from developing. Unfortunately this also turns off important electronic circuitry downstream.

4. Catastrophic Failure—A dangerous amount of heat is developed from the surge suppression device from a limited current passing through the surge suppressor to ground. This current may be limited because of outside voltage conditions (i.e., tree fallen on a power pole) where the excessive voltage is sufficient to turn on the surge suppressor for more than a few micro-seconds but still having only a limited amount of current well-below the fuse, or in-line breaker, ratings. This is an overheat condition which can also occur in a surge suppressor component that is near its end of life and that has failed toward a shorted condition ("low" but not "very low" impedance) but has not failed totally shorted. The "low" impedance to a normally applied voltage allows a limited current to flow through the surge suppression device and allows a huge amount of heat to develop within the surge suppressor component thereby causing dangerous conditions such as smoke and fire to exist.

The use of internal thermal fuses (also known as thermal switches) in the surge suppression circuitry eliminates the weakness in both steps 3 and 4 above. A thermal fuse not only acts like a normal fuse which will blow in a permanent failed condition with normal inrush current conditions, but will also sense the build-up of heat leading to a catastrophic failure of a surge suppressor component.

The encapsulation of surge suppression circuitry in epoxy, and the placement of surge suppression circuitry in a silica sand environment, rather than in an air environment, is now an industry standard among most companies that produce surge suppression devices. The primary reason is that the sudden superheating of air adjacent an overheated surge suppressor inside a sealed environment has resulted in explosions of the container incorporating the surge suppression circuitry and has ignited fires both inside and outside the container. The technique of fully encapsulating surge suppression circuitry in epoxy, however, doesn't allow any thermal expansion of the circuit components and, in catastrophic failure conditions, causes dangerous explosive conditions to exist. Silica sand is a poor conductor of heat (an insulator) but acts as a good smothering agent in case of fire inside of the surge suppression circuitry container.

Various attempts have been made in the prior art to use a thermal fuse to sense when an MOV is approaching the end of its life so that power may be removed from the MOV prior to any failure of the MOV. Typically, this is achieved by detecting heat radiated from the MOV, which heat is indicative of the MOV entering a low resistance mode. Such an approach has been found to be very unreliable for circuitry which may be subjected to a wide range of environmental mediums and temperatures. Further, humidity and barometric pressure, when the environment is air, can affect the temperature at which a radiated heat sensitive thermal fuse operates. Finally, the spacing between the thermal fuse and the MOV is critical. Mislocations or accidental dislocations of this spacing may cause the MOV to become so hot that it will burst into flames before the thermal fuse is activated to an open condition. As known to many in the art, the thermal fuse commonly used not only opens at a given set temperature such as 200 degrees F., it may have a current rating of some value such as 15 amperes. The current rating used in the industry is a function of time as well as current (i.e., it is really a power sensitive fuse). Thus such a device may not open even though a current surge in the range of thousands of amperes flows through the device if the time is very short such as a few microseconds.

As used in this application, the term "environment" will be used to refer to all factors that may affect the radiation or transfer of heat away from the surface of a surge suppression component. As is known to those skilled in the art, surge suppression circuitry may be open to the air or enclosed in a sealed container. Further the surge suppression circuitry components may be encased in a potting compound or otherwise surrounded by a dielectric other than air such as silica sand. Each of these conditions substantially affects the rate of radiant heat transfer from a heat source to an adjacent radiant heat sensor.

Also used in this application, the term surge suppression component ("SSC") will be used to refer to any device that performs the function of surge suppression (also known as surge protection) including metal oxide varistors (MOV's), carbon based suppressors, avalanche based diodes, Transorbs™, gas tubes, and the like.

One of the more difficult problems in physically locating a thermal fuse relative to heat-dissipating SSC's, such as an MOV, occurs when silica sand is used as a dielectric insulator inside the product. As mentioned above, silica has become an industry standard method used to minimize the risk of heat rising too fast within the closed confines of a sealed box wherein the pressures generated by the heat could cause an explosion. When silica sand is used as part of a safety technique, the heat transferring capability of the component to the environment around the component is completely changed from what it would be without the silica sand. Thus, prior art surge suppressors were required to use different designs and component placements in accordance with the specific environment the circuit would be subjected to in end use. Such a multiplicity of designs resulted in great inefficiencies in production thereby increasing end product costs. Furthermore, since silica sand is an insulator, the spacing is more critical than it is in air for radiant heat sensing of an overheat condition of the SSC.

Some prior art circuits have attempted to utilize the increased current-carrying capacity of two thermal fuses connected in parallel in a manner similar to that shown in FIG. 1. Such a circuit has been implemented by placing the two thermal fuses on opposite sides of the heat producing element (i.e., the MOV). However, this approach created many problems in accurately locating the thermal fuses with respect to the MOV such that they would both open at substantially the same time. The result was that an explosion often occurred before radiant heat opened the second thermal fuse. The location problem was exacerbated by the use of silica sand as an insulating dielectric between the MOV and the adjacent thermal fuses.

It has also been found that, when a single thermal fuse is used in series with an MOV, a voltage surge may destroy (i.e., open) the thermal fuse even though the MOV is still operational.

It would thus be desirable to provide a more reliable method of transferring heat from a surge suppression component (SSC) to a thermal fuse whereby the surface temperature of the SSC varies over a smaller range under environmental temperature extremes before an associated thermal fuse opens. It would be further desirable to have a circuit that operates in a consistent or predictable manner over a wide range of environments (such as both air and silica sand). It would also be desirable to provide a surge suppression circuit design that allows the failure of a thermal fuse component while still providing surge suppression for the connected line and associated downstream circuits or equipment.

SUMMARY OF THE INVENTION

The present invention minimizes the effects of environmental factors which influence the opening of a thermal fuse in a surge suppressor prior to failure of a surge suppression component (SSC) of the surge suppressor. According to the present invention, this is done by conducting heat between leads of the thermal fuse and the SSC, rather than radiating heat through the environment, to cause the thermal fuse to open. Such an approach allows greater freedom in component placement on a printed circuit board and minimizes delays in the opening of the thermal fuse due to the location of the thermal fuse relative to the SSC or due to the use of an environment other than an environment for which that surge suppressor was specifically designed.

In an alternate embodiment of the invention, an array of thermal fuses are connected in parallel so that, if one thermal fuse fails, the circuit will still remain functional. Since a majority of the current in a transient surge typically travels through one SSC having the lowest resistance of an array of SSC's connected in parallel, the array of thermal fuses connected in parallel permit one thermal fuse to open without causing the remaining thermal fuses to open.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is an elevational view of a surge suppressor embodying features of the prior art;

FIG. 2 is a perspective view of surge suppressor embodying features of the present invention;

FIG. 3 is a schematic diagram of an alternate embodiment of the present invention in which two thermal fuses are utilized;

FIG. 4 is a plan view of a printed circuit board exemplifying how the embodiment of FIG. 3 may be physically laid out;

FIG. 5 is a schematic diagram of an alternate embodiment of the present invention in which four thermal fuses are utilized in conjunction with an indicator which indicates the operational status of the surge suppressor;

DETAILED DESCRIPTION

Figure 6:
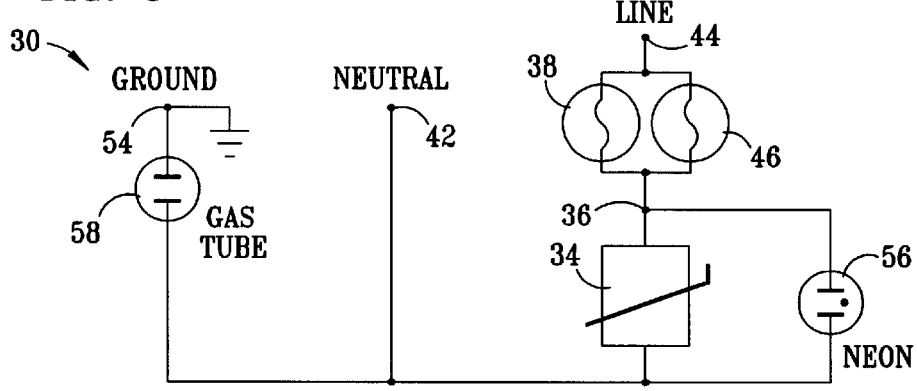
FIG. 6 is a schematic diagram of an alternate embodiment of the present invention in which two thermal fuses are utilized in conjunction with an indicator that indicates the operational status of the surge suppressor and a gas tube that is connected between a neutral and a ground terminal.

Referring to FIG. 1 of the drawings, the reference numeral 10 generally designates a surge suppressor embodying features of the prior art. The surge suppressor 10 includes a printed circuit board (PCB) 11 on which are mounted a first surge suppression component (SSC) 12, such as a varistor, a second SSC 14, such as a varistor, and a thermal fuse 16 (also known as a thermal switch). While not shown, additional SSC's may connected in parallel with the SSC's 12 and 14 to increase the surge-handling capacity of the surge suppressor 10. The SSC 12 includes two leads 18 and 20, and the SSC 14 includes two leads 24 and 26, all four of which leads are soldered to the PCB 11. The thermal fuse 16 includes a first lead 22 and a second lead 28 which are also soldered to the PCB 11 (though the soldering of only the first lead 22 is shown in FIG. 1). In practice, the lead 22 is electrically connected via the PCB 11 to the leads 20 and 26 of the SSC's 12 and 14, respectively. Dielectric mediums 13 and 15, such as air, silica sand, or the like, having a thickness of L1 and L2, respectively, are interposed between the thermal fuse 16 and the SSC's 12 and 14, respectively.

In operation, when sufficient current passes through the SSC's 12 and 14 to heat the SSC's, heat is transferred through the dielectric mediums 13 and 15 to the thermal fuse 16, thereby causing the temperature of the thermal fuse to rise. When the temperature of the thermal fuse 16 reaches a predetermined level, the thermal fuse opens, and cuts off the flow of current through the SSC's 12 and 14.

A drawback with the foregoing surge suppressor 10 is that, to maintain consistent operation, the thickness L1 and L2 of the dielectric mediums 13 and 15, respectively, must be maintained within limits which are determined based on the choice of the dielectric mediums 13 and 15, and of the SSC's 12 and 14, used. A minor variation of the thicknesses L1 and L2 will cause the thermal fuse 16 to open too soon, rendering the SSC's less useful, or to open too late, thereby either shorting the SSC's or igniting the SSC's on fire. For example, if the thicknesses L1 or L2 are too large or if an incorrect dielectric 13 or 15 is used, the thermal fuse 16 may not open until after one or both of the SSC's 12 and 14 have shorted and/or caught fire. Another drawback is that if, in the environment of the surge suppressor 10, the temperature is very low and/or the humidity is very high, then the heat radiated from the SSC's 12 and 14 will not raise the temperature of the thermal fuse 16 as quickly as it might otherwise, and the SSC's may experience catastrophic failure. Yet another drawback of the surge suppressor 10 shown in FIG. 1 is that, due to the requirement that the thermal fuse be physically located very close to the SSC's 12 and 14, the surge suppressor 10 can not be readily adapted to handle additional SSC's or thermal fuses by parallel connections.

In FIG. 2, a surge suppressor of the present invention is shown which provides for a more robust and reliable medium through which heat may be transferred from an SSC to a thermal fuse. Accordingly, the surge suppressor shown in FIG. 2, designated by the reference numeral 30, includes a printed circuit board (PCB) 32 on which is mounted an electrical component such as a suitable SSC 34, such as a metal oxide varistor (MOV), carbon based suppressor, avalanche based diode, Transorb™, gas tube, or the like, well-known in the art, having a first lead line 34a and a second lead line 34b. The first lead line 34a is electrically connected via a first trace 35 to a first terminal 42 configured for connection to a neutral or ground line (not shown), depending upon the circuit application. The second lead line 34b is electrically and thermally connected via a circuit conductor, or pad, 36 to a first lead line 38a of a thermal fuse 38. The pad 36 may comprise any material which is suitable for conducting both electricity and heat. The pad 36 may thus be fabricated as any trace on the PCB 32 would be fabricated in a conventional manner using substantially the same material, such as copper or other suitable metal effective for conducting both heat and current. The thermal fuse 38 includes a second lead line 38b which electrically connects the thermal fuse 38 via a second trace 40 to a second terminal 44 configured for connection to line voltage (not shown).

It is to be understood that, while the terminal 42 is described herein as connected to ground or neutral, and the terminal 44 as connected to line voltage, the terminal 42 may be connected to line voltage, and the terminal 44 connected to neutral or ground. It is to be still further understood that voltage applied to the circuit 30 may be either AC or DC. SSC's, thermal conductors, and thermal fuses, taken individually, and the operation of such, operating individually, are considered to be well-known in the art and, therefore, will not be discussed in greater detail.

As discussed further below, if it would be desirable to increase the current-carrying capacity of the surge suppressor 30, additional SSC's (not shown in FIG. 2) may be connected in parallel across the SSC 34, and additional thermal fuses (not shown in FIG. 2) may be connected in parallel across the thermal fuse 38.

In operation, the terminal 44 is connected to line voltage (not shown) and the terminal 42 is connected to a neutral or ground line (not shown), depending upon the circuit application. As a voltage potential is applied across the terminals 42 and 44, and current begins to flow through the surge suppressor 30, the temperature of the SSC 34 rises. As the temperature of the SSC 34 rises, heat is generated which is transferred from the SSC 34 through the pad 36 to the thermal fuse 38. Under normal operating conditions, the temperature of the SSC 34 and, thus, also of the thermal fuse 38, stabilizes and does not continue to rise beyond an acceptable temperature, thereby permitting current to continue to flow through the surge suppressor 30 for an indefinite period of time.

If the line voltage across the terminals 42 and 44 exceeds the voltage for which the surge suppressor was designed for under normal operating conditions, then the temperature of the SSC 34 rises beyond an acceptable level, and greater heat is generated and transferred from the SSC 34 via the pad 36 to the thermal fuse 38, thereby causing the thermal fuse to rise in temperature beyond an acceptable level. When the temperature of the thermal fuse 38 rises to such a level, it prevents further current from flowing through the surge suppressor, thereby protecting the SSC's from excessive current flow which could destroy the SSC and potentially ignite a fire.

By the use of the surge suppressor 30 shown in FIG. 2, wherein heat is conducted through the pad 36 rather than radiated through air as practiced in the prior art, the thermal fuse 38 may be physically positioned anywhere on the PCB 32 without regard to the position of the SSC 34. Therefore, the surge suppressor 30 can be manufactured and maintained more economically than is possible under the prior art, such as illustrated in FIG. 1. Furthermore, because the performance of the surge suppressor 30 is not sensitive to the position of the thermal fuse with respect to the SSC 34, the surge suppressor 30 is more reliable and its performance is more predictable than that of the prior art. Still, further, the surge suppressor 30 permits additional SSC's and/or thermal fuses to be more readily added to the surge suppressor 30, as discussed below, than is possible under the prior art.

Alternate embodiments of the surge suppressor 30 of the present invention are shown in FIGS. 3–8, in which identical components are given the same reference numerals. According to the embodiment of FIG. 3, the surge suppressor 30 is adapted for handling a greater flow of current than the embodiment shown in FIG. 2. To this end, an additional thermal fuse 46 is connected in parallel with the thermal fuse 38. Otherwise, the embodiment of FIG. 3 is identical to that of FIG. 2. Operation of the surge suppressor 30 shown in FIG. 3 is similar to the operation of the surge suppressor shown in FIG. 2, the only material difference being that the surge suppressor shown in FIG. 3 can handle a greater flow of current.

FIG. 4 exemplifies how the embodiment shown in FIG. 3 may be physically laid out on the PCB 32 and, more particularly, how far the SSC 34 may be physically removed from the thermal fuses 38 and 46. Accordingly, the PCB 32 includes the terminals 42 and 44, and a relatively wide heat-transferring pad 36. The thermal fuses 38 and 46 are connected in parallel between the terminal 44 and the pad 36, and the SSC 34 is connected between pad 36 and the terminal 42. A dashed line 32a represents other components of the PCB 32. It can be appreciated from an examination of FIG. 4 that, unlike the prior art surge suppressor 10 depicted in FIG. 1, the SSC 34 may be relatively far removed from the thermal fuses 38 and 46. As a result of the distance separating the SSC 34 and the thermal fuses 38 and 46, a longer period of time is required for heat to be transferred from the SSC 34 to the thermal fuses 38 and 46. As the temperature of the SSC 34 rises prior to failure, there will be a lag time for the heat to transfer to the thermal fuses 38 and 46. Such a lag may be accounted for by designing the thermal fuses 38 and 46 to blow at a suitable temperature below the temperature at which the SSC 34 would fail.

In addition to the advantages described above with respect to the previous embodiment shown in FIG. 2, the embodiments shown in FIGS. 3–4 illustrate how the current-carrying capacity of the present invention may be readily increased as desired. Moreover, if one thermal fuse 38 or 46 fails, the surge suppressor 30 will still remain viable.

According to the embodiment of FIG. 5, the surge suppressor 30 is adapted for handling a greater flow of current than the embodiment shown in any of FIGS. 2–4, and is provided with an indicator effective for indicating when then surge suppressor is operative. To that end, three additional thermal fuses 46, 48, and 50 are connected in parallel across the thermal fuse 38, and an additional SSC 52 is connected between the pad 36 and a ground 54. An indicator 56, such as a neon light, is connected in parallel across the SSC 34. While not shown and generally not necessary, an additional indicator may also be connected in parallel across the SSC 52. Line voltage is connected to the terminal 44 and neutral is connected to the terminal 42, as in FIG. 2. Operation of the surge suppressor 30 shown in FIG. 5 is similar to the operation of the surge suppressor shown in FIG. 2, the only material difference being that the surge suppressor shown in FIG. 5 can handle a greater flow of current, and activation or illumination of the indicator 56 indicates that the surge suppressor 30 is operational.

According to the embodiment of FIG. 6, the additional thermal fuse 46 is connected in parallel across the thermal fuse 38, and the indicator 56 is connected in parallel across the SSC 34. Additionally, a gas tube 58 having a breakdown voltage well-known in the art, is connected between the neutral 42 and the ground terminal 54. In operation, if the surge suppressor 30 receives a voltage spike sufficient to cause the potential between the neutral terminal 42 and the ground terminal 54 to exceed the breakdown voltage of the gas tube 58, then the gas tube "breaks down" and shunts energy from the spike to the ground terminal 54.

Figure 7:
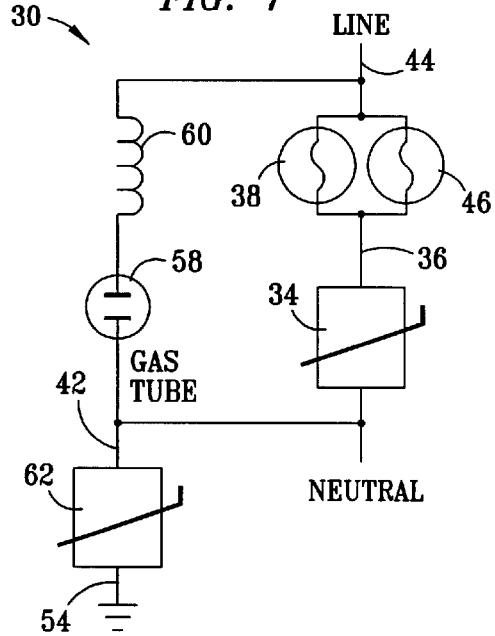
FIG. 7 is a schematic diagram of an alternate embodiment of the present invention in which two thermal fuses are utilized in conjunction with a gas tube connected in series with an inductor.

According to the embodiment of FIG. 7, the additional thermal fuse 46 is connected in parallel across the thermal fuse 38, and the gas tube 58 is connected in series with an inductor 60 between the terminals 42 and 44 to provide additional high-voltage AC protection, even when the SSC 34 fails (i.e., overheats) and causes the thermal fuses 38 and 46 to blow open. An additional SSC 62 is connected between the neutral terminal 42 and the ground terminal 54. In operation, when there is a transient surge, the SSC 34 initially absorbs the surge for a few microseconds. If the transient lasts for more than a few microseconds, then the gas tube 58 enters an arc mode and absorbs the additional current. The SSC 62 will activate any time there is a transient surge induced on the neutral terminal 54 referenced to ground. When the transient surge subsides, AC is impeded by the inductor 58, and the gas tube 58 exits the arc mode.

Figure 8:
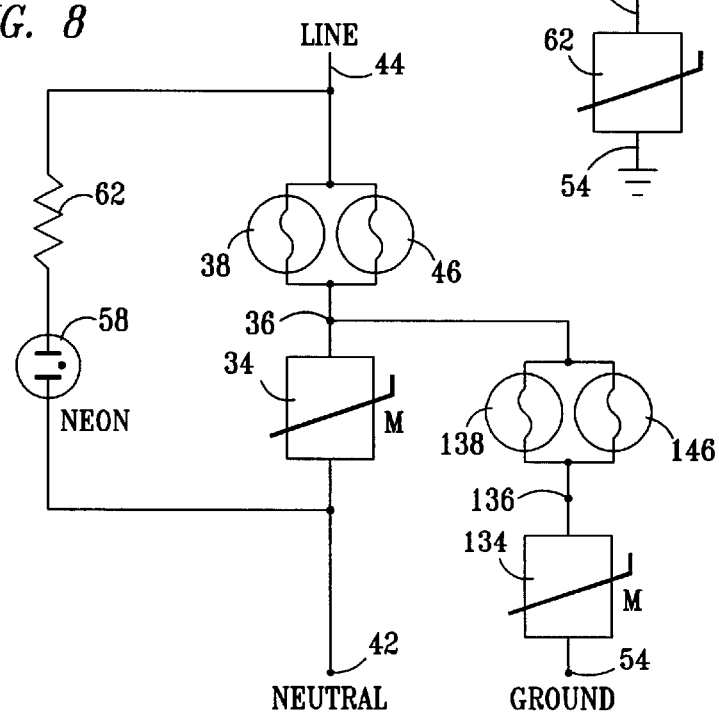
FIG. 8 is a schematic diagram of an alternate embodiment of the present invention in which four thermal fuses are utilized as two thermal fuse pairs in parallel in conjunction with a gas tube connected in series with a resistor.

According to the embodiment of FIG. 8, the additional thermal fuse 46 is connected in parallel across the thermal fuse 38, and the gas tube 58 is connected in series with a resistor 62 between the terminals 42 and 44. Two additional thermal fuses 138 and 146 are connected in parallel between the pad 36 and an additional conductive pad 136. An additional SSC 134 is connected between the pad 136 and the ground 54. In operation, the thermal fuses 38 and 46 protect the SSC 34 against line-to-neutral surges, and the thermal fuses 138 and 146 protect the SSC 134 against neutral-to-ground surges. Thus, all-mode protection is obtained because all phases are protected. Depending on the distance of the thermal fuses 138 and 146 from the SSC 34, the thermal fuses 138 and 146 may also protect the SSC 34 against line-to-neutral surges.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the spirit and scope of the invention.

What is claimed is:

1. A surge suppressor comprising:
   a thermally and electrically conductive pad bonded to a printed circuit board (PCB);
   an electrical component thermally connected to the conductive pad; and
   at least one thermal fuse thermally and electrically connected to the conductive pad to receive from the electrical component, via the conductive pad, heat thermally conducted from the electrical component to increase the temperature of the at least one thermal fuse in response to an increase in temperature of the electrical component, the thermal fuse being configured to open in response to heat, the configuration and thermal conductivity of the pad being such that the amount of heat transferred through the pad from the electrical component to the thermal fuse is greater than the amount of heat transferred from the electrical component to the thermal fuse by other thermal means.

2. The surge suppressor of claim 1 wherein the at least one thermal fuse is connected in series with the electrical component.

3. The surge suppressor of claim 1 wherein the electrical component is thermally connected to the conductive pad via a lead line connected to the electrical component, and the thermal fuse is thermally connected to the conductive pad via a lead line connected to the thermal fuse.

4. The surge suppressor of claim 1 wherein the electrical component is a surge suppression component.

5. The surge suppressor of claim 1 wherein the electrical component is a surge suppression component selected from the group consisting of a metal oxide varistor (MOV), a diode, and a gas tube.

6. The surge suppressor of claim 1 wherein the at least one thermal fuse comprises at least two thermal fuses connected in parallel.

7. The surge suppressor of claim 1 wherein the predetermined temperature of the thermal fuse is correlated with a predetermined temperature of the electrical component which would precipitate failure of the electrical component.

8. The surge suppressor of claim 1 further comprising an indicator connected in parallel across the electrical component to indicate operation of the surge suppressor.

9. The surge suppressor of claim 1 further comprising an neon light connected in parallel across the electrical component to indicate operation of the surge suppressor.

10. The surge suppressor of claim 1 further comprising an neon light connected in parallel across the electrical component to indicate operation of the surge suppressor, and an additional electrical component connected between the conductive pad and a ground terminal.

11. The surge suppressor of claim 1 further comprising a gas tube connected in series between the electrical component and a ground terminal.

12. The surge suppressor of claim 1 further comprising a serially connected gas tube and inductor connected in parallel across the electrical component and the at least one thermal fuse; and wherein the electrical component is a first electrical component and a second electrical component is connected in series between the first electrical component and a ground terminal.

13. The surge suppressor of claim 1 further comprising a serially connected gas tube and resistor connected in parallel across the electrical component and the at least one thermal fuse; and wherein the electrical component is a first electrical component, the conductive pad is a first conductive pad, and a second electrical component is connected in series via a second conductive pad with an additional at least one thermal fuse between the first conductive pad and a ground terminal.

14. The surge suppressor of claim 1 wherein the conductive pad comprises copper.

15. The surge suppressor of claim 1 wherein the thermal fuse opens prior to combustion of the electrical component.

16. The surge suppressor of claim 1 wherein the heat is generated by a high electrical voltage and limited current flowing through the electrical component.

17. The surge suppressor of claim 1 wherein additional heat is generated internally by current flowing through the thermal fuse.

18. The surge suppressor of claim 15 wherein the heat is generated by at least one or both of a high electrical voltage and limited current flowing through the electrical component and additional heat is generated by current flowing through the thermal fuse.

19. The surge suppressor of claim 1 wherein the thermal fuse is configured to open in response to heat transferred through the conductive pad rather than heat radiated through the environment.

20. A method for preventing an electrical component mounted on a printed circuit board from destructively overheating, comprising the steps of:
   attaching a lead line of the electrical component to a thermally and electrically conductive pad mounted on a printed circuit board;
   attaching a lead line of at least one thermal fuse to the conductive pad to permit heat generated by the electrical component to transfer through the conductive pad to the at least one thermal fuse; and
   configuring the at least one thermal fuse to open in response to heat thermally conducted from the electrical component through the pad to the thermal fuse as a result of an increase in temperature of the electrical component, the configuration and thermal conductivity of the pad being such that the amount of heat transferred through the pad from the electrical component to the thermal fuse due to an increase in temperature of the electrical component is greater than the amount of heat transferred from the electrical component by other thermal means.

21. The method of claim 20 wherein the step of attaching a lead line of at least one thermal fuse to the conductive pad further comprises attaching a lead line of at least two thermal fuses connected in parallel to the conductive pad.

22. The method of claim 20 wherein the electrical component is an element of a surge suppressor.

23. The method of claim 20 wherein the electrical component is a surge suppression component.

24. The method of claim 20 wherein the electrical component is selected from the group consisting of a metal oxide varistor (MOV), a diode, and a gas tube.

25. The method of claim 20 wherein the conductive pad comprises copper.

26. The method of claim 20 further comprising the step of positioning the at least one thermal fuse relative to the electrical component so that the quantity of heat conducted from the electrical component to the at least one thermal fuse exceeds the quantity of heat radiated from the electrical component to the at least one thermal fuse.

27. The method of claim 20 further comprising the step of correlating the predetermined temperature of the thermal fuse with a predetermined temperature of the electrical component which would precipitate failure of the electrical component.

28. The method of claim 20 further comprising connecting an indicator in parallel across the electrical component to indicate operation of the surge suppressor.

29. The method of claim 20 further comprising connecting a neon light in parallel across the electrical component to indicate operation of the surge suppressor.

30. The method of claim 20 further comprising connecting a neon light in parallel across the electrical component to indicate operation of the surge suppressor, and connecting an additional electrical component between the conductive pad and a ground terminal.

31. The method of claim 20 further comprising connecting a gas tube in series between the electrical component and a ground terminal.

32. The method of claim 20 further comprising connecting a serially connected gas tube and inductor in parallel across the electrical component and the at least one thermal fuse; and wherein the electrical component is a first electrical component and the method further comprises connecting a second electrical component in series between the first electrical component and a ground terminal.

33. The method of claim 20 further comprising connecting a serially connected gas tube and resistor in parallel across the electrical component and the at least one thermal fuse; and wherein the electrical component is a first electrical component, the conductive pad is a first conductive pad, and the method further comprises connecting a second electrical component in series via a second conductive pad with an additional at least one thermal fuse between the first conductive pad and a ground terminal.

34. The method of claim 20 wherein the thermal fuse opens prior to combustion of the electrical component.

35. The method of claim 20 wherein the heat is generated by a high electrical voltage and limited current flowing through the electrical component.

36. The method of claim 20 wherein additional heat is generated internally by current flowing through the thermal fuse.

37. The method of claim 34 wherein the heat is generated by at least one or both of a high electrical voltage and limited current flowing through the electrical component and additional heat is generated by current flowing through the thermal fuse.

38. The method of claim 20 wherein the thermal fuse opens in response to heat received from the electrical component through the conductive pad rather than heat radiated through the environment.

39. A method for protecting a circuit by preventing an electrical component mounted on a printed circuit board (PCB) from overheating, comprising the steps of:
attaching one lead line of the electrical component to a thermally and electrically conductive pad bonded to the PCB; and
permitting heat to be conducted from the conductive pad to a lead line of at least one thermal fuse configured to open in response to heat conducted to the thermal fuse through the conductive pad from the electrical component in response to an increase in temperature of the electrical component, the configuration and thermal conductivity of the pad being such that the amount of heat thermally transferred through the pad from the electrical component to the thermal fuse is greater than the amount of heat transferred to the thermal fuse by other thermal means.

40. The method of claim 39 wherein the at least one thermal fuse further comprises at least two thermal fuses connected in parallel.

41. The method of claim 39 wherein the electrical component is an element of a surge suppressor.

42. The method of claim 39 wherein the electrical component is a surge suppression component.

43. The method of claim 39 wherein the electrical component is selected from the group consisting of a metal oxide varistor (MOV), a diode, and a gas tube.

44. The method of claim 39 wherein the conductive pad comprises copper.

45. The method of claim 39 further comprising the step of positioning the at least one thermal fuse relative to the electrical component so that the quantity of heat conducted from the electrical component to the at least one thermal fuse exceeds the quantity of heat radiated from the electrical component to the at least one thermal fuse.

46. The method of claim 39 further comprising the step of correlating the predetermined temperature of the thermal fuse with a predetermined temperature of the electrical component which would precipitate failure of the electrical component.

47. The method of claim 39 further comprising connecting an indicator in parallel across the electrical component to indicate operation of the surge suppressor.

48. The method of claim 39 further comprising connecting a neon light in parallel across the electrical component to indicate operation of the surge suppressor.

49. The method of claim 39 further comprising connecting a neon light in parallel across the electrical component to indicate operation of the surge suppressor, and connecting an additional electrical component between the conductive pad and a ground terminal.

50. The method of claim 39 further comprising connecting a gas tube in series between the electrical component and a ground terminal.

51. The method of claim 39 further comprising connecting a serially connected gas tube and inductor in parallel across the electrical component and the at least one thermal fuse; and wherein the electrical component is a first electrical component and the method further comprises connecting a second electrical component in series between the first electrical component and a ground terminal.

52. The method of claim 39 further comprising connecting a serially connected gas tube and resistor in parallel across the electrical component and the at least one thermal fuse; and wherein the electrical component is a first electrical component, the conductive pad is a first conductive pad, and the method further comprises connecting a second electrical component in series via a second conductive pad with an additional at least one thermal fuse between the first conductive pad and a ground terminal.

53. The method of claim 39 wherein the thermal fuse opens prior to combustion of the electrical component.

54. The method of claim 39 wherein the heat is generated by a high electrical voltage and limited current flowing through the electrical component.

55. The method of claim 39 wherein additional heat is generated internally by current flowing through the thermal fuse.

56. The method of claim 53 wherein the heat is generated by at least one or both of a high electrical voltage and limited current flowing through the electrical component and additional heat is generated by current flowing through the thermal fuse.

57. The method of claim 39 wherein the thermal fuse is configured to open in response to an increase in temperature primarily due to heat received through the conductive pad rather than heat radiated through the environment.

58. A surge suppressor comprising:
a thermally and electrically conductive pad bonded to a printed circuit board (PCB);
an electrical component thermally and electrically connected to the conductive pad; and
at least one thermal fuse thermally and electrically connected to the conductive pad to receive heat thermally conducted from the electrical component via the conductive pad due to an increase in temperature of the electrical component, the thermal fuse being configured to open in response to heat, the configuration and thermal conductivity of the pad being such that the amount of heat transferred through the pad to the thermal fuse from the electrical component due to an increase in temperature of the electrical component is greater than the amount of heat transferred to the thermal fuse by other thermal means.

59. The surge suppressor of claim 58 wherein the at least one thermal fuse is connected in series with the electrical component.

60. The surge suppressor of claim 58 wherein the electrical component is thermally connected to the conductive pad via a lead line connected to the electrical component, and the thermal fuse is thermally connected to the conductive pad via a lead line connected to the thermal fuse.

61. The surge suppressor of claim 58 wherein the electrical component is a surge suppression component.

62. The surge suppressor of claim 58 wherein the electrical component is a surge suppression component selected from the group consisting of a metal oxide varistor (MOV), a diode, and a gas tube.

63. The surge suppressor of claim 58 wherein the at least one thermal fuse comprises at least two thermal fuses connected in parallel.

64. The surge suppressor of claim 58 wherein the predetermined temperature of the thermal fuse is correlated with a predetermined temperature of the electrical component which would precipitate failure of the electrical component.

65. The surge suppressor of claim 58 further comprising an indicator connected in parallel across the electrical component to indicate operation of the surge suppressor.

66. The surge suppressor of claim 58 further comprising an neon light connected in parallel across the electrical component to indicate operation of the surge suppressor.

67. The surge suppressor of claim 58 further comprising an neon light connected in parallel across the electrical component to indicate operation of the surge suppressor, and an additional electrical component connected between the conductive pad and a ground terminal.

68. The surge suppressor of claim 58 further comprising a gas tube connected in series between the electrical component and a ground terminal.

69. The surge suppressor of claim 58 further comprising a serially connected gas tube and inductor connected in parallel across the electrical component and the at least one thermal fuse; and wherein the electrical component is a first electrical component and a second electrical component is connected in series between the first electrical component and a ground terminal.

70. The surge suppressor of claim 58 further comprising a serially connected gas tube and resistor connected in parallel across the electrical component and the at least one thermal fuse; and wherein the electrical component is a first electrical component, the conductive pad is a first conductive pad, and a second electrical component is connected in series via a second conductive pad with an additional at least one thermal fuse between the first conductive pad and a ground terminal.

71. The surge suppressor of claim 58 wherein the conductive pad comprises copper.

72. The method of claim 58 wherein the thermal fuse opens prior to combustion of the electrical component.

73. The method of claim 58 wherein the heat is generated by a high electrical voltage and limited current flowing through the electrical component.

74. The method of claim 58 wherein additional heat is generated internally by current flowing through the thermal fuse.

75. The method of claim 72 wherein the heat is generated by at least one or both of a high electrical voltage and limited current flowing through the electrical component and additional heat is generated by current flowing through the thermal fuse.

76. A method for preventing an electrical component mounted on a printed circuit board from destructively overheating, comprising the steps of:
attaching a lead line of the electrical component to a thermally and electrically conductive pad mounted on a printed circuit board;
attaching a lead line of at least one thermal fuse to the conductive pad to permit heat generated by an increase in temperature of the electrical component to transfer through the conductive pad to the at least one thermal fuse; and
configuring the at least one thermal fuse to open when the temperature of the at least one thermal fuse exceeds a predetermined temperature in response to heat, the configuration and thermal conductivity of the pad being such that the amount of temperature increase of the thermal fuse due to heat transferred from the electrical component through the pad to the thermal fuse is greater than the amount of heat transferred to the thermal fuse by other thermal means.

* * * * *